United States Patent
Cripe

(10) Patent No.: US 12,062,845 B1
(45) Date of Patent: Aug. 13, 2024

(54) NON-FOSTER CIRCUIT FOR ANTENNA BROADBANDING USING TIME VARIANT FILTERS

(71) Applicant: Rockwell Collins, Inc., Cedar Rapids, IA (US)

(72) Inventor: David W. Cripe, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 157 days.

(21) Appl. No.: 17/991,631

(22) Filed: Nov. 21, 2022

(51) Int. Cl.
  *H01Q 1/48* (2006.01)

(52) U.S. Cl.
  CPC ..................................... *H01Q 1/48* (2013.01)

(58) Field of Classification Search
  CPC ...... H04B 1/18; H04B 1/0458; H04B 1/1027; H04B 1/48; H04B 17/104; H04B 17/21; H04B 17/309; H04B 17/336; H04B 17/345; H04B 7/22; H01Q 1/362; H01Q 1/48; H01Q 9/38; H01Q 15/002; H01Q 15/148; H03H 11/30; H03H 7/40; H03H 11/44
  See application file for complete search history.

(56) References Cited

U.S. PATENT DOCUMENTS

| | | | | |
|---|---|---|---|---|
| 6,369,651 B2* | 4/2002 | Dent | ................. | H03F 3/211 330/297 |
| 7,202,734 B1* | 4/2007 | Raab | ................. | H03F 3/04 330/306 |
| 7,656,228 B2 | 2/2010 | Fukuda et al. | | |
| 7,859,474 B1 | 12/2010 | Cripe et al. | | |
| 8,233,861 B1 | 7/2012 | Cripe et al. | | |
| 8,988,173 B2 | 3/2015 | Hitko et al. | | |
| 9,425,769 B1* | 8/2016 | White | ................. | H01Q 15/008 |
| 11,026,027 B2 | 6/2021 | Shriner et al. | | |
| 11,057,020 B1 | 7/2021 | Graceffo et al. | | |
| 11,290,067 B2 | 3/2022 | Yamaguchi | | |
| 2008/0242237 A1* | 10/2008 | Rofougaran | ............. | H04B 1/18 455/77 |
| 2016/0218759 A1* | 7/2016 | Robey | ................. | H04B 1/1027 |

FOREIGN PATENT DOCUMENTS

GB 2536738 B 8/2017

* cited by examiner

*Primary Examiner* — Monica C King
(74) *Attorney, Agent, or Firm* — Suiter Swantz IP

(57) ABSTRACT

A synthesized non-Foster time-variant filter is disclosed for matching impedance. The synthesized non-Foster time-variant filter may include a negative-inductor circuit and a negative-capacitor circuit. The negative-inductor circuit and the negative-capacitor circuit may be configured to be dynamically controlled based on a known transmit signal. The negative-inductor circuit may be configured to synthesize a negative inductance of a range of inductances. The negative-capacitor circuit may include a plurality of capacitors coupled together in parallel. Each capacitor may include a first capacitor end and a second capacitor end. The negative-capacitor circuit may be configured to synthesize a negative capacitance of a range of capacitances. The negative-capacitor circuit may include a plurality of inductors coupled together in series. Each inductor may include a first inductor end and a second inductor end.

20 Claims, 7 Drawing Sheets

NON-FOSTER CIRCUIT FOR ANTENNA BROADBANDING USING TIME VARIANT FILTERS

TECHNICAL FIELD

Embodiments of the inventive concepts disclosed herein are directed generally to impedance matching of antennas and, more particularly, using time-variable negative capacitance elements and time-variable negative inductance elements to match impedance of antennas.

BACKGROUND

It has long been appreciated that antennas are limited in the bandwidth over which they may be operated efficiently. An antenna is constrained in its signal bandwidth by its dimensions and geometry. The performance of an antenna diminishes as its dimension, as a fraction of the electrical wavelength, falls significantly below $\lambda/2$. This relationship has been quantified in the Wheeler-Chu equation, which defines the Q (and bandwidth) of an antenna as being proportional to the ratio of the length of the antenna to a radiated wavelength of the operating frequency, to the third power. In the history of radio engineering, this rule has proven unbreakable and inviolate.

For electrically short antennas particularly, this high 'Q' limits the possible modulation bandwidth. For purposes of this disclosure, electrically small/short antennas are defined as having maximum dimensions of less than $\frac{1}{10}$ of a wavelength of its operating frequency.

All antennas may be modelled as network of resistors, inductors and capacitors which can duplicate a feedpoint impedance over a nominal frequency range. It is understood that this network may be, at least in theory, preceded by a dual circuit, in which all components in the antenna model are replaced by their negative counterparts. This unconventional means of broadbanding an antenna is referred to as a non-Foster circuit. Non-Foster circuits are comprised of circuits mimicking negative inductors and negative capacitors, which are themselves typically comprised of opamp circuits. Non-Foster antenna broadbanding circuits have been demonstrated in the context of radio receiver applications, where the improved matching of antenna to receiver improves the signal-to-noise ratio of received signals.

However, the use of non-Foster circuits for transmit applications presents challenges. The opamp circuits typically employed for synthesis of negative inductors and negative capacitors have a limited dynamic range which limits their utility to tens or hundreds of milliwatts. Consequently, using such opamp circuits is impractical for exceeding the Wheeler-Chu limitation at a high RF power (e.g., higher than 100 milliwatts). Such opamp circuits would result in low efficiency and require much higher transmission power to compensate for the low transmission efficiency.

Consequently, there exists a need for improved methods and systems for efficiently transmitting with electrically short antennas in a high RF power broadbanding configuration.

SUMMARY

A synthesized non-Foster time-variant filter is disclosed, in accordance with one or more embodiments of the present disclosure. In some embodiments, the synthesized non-Foster time-variant filter may include a negative-inductor circuit and a negative-capacitor circuit. In some embodiments, the negative-inductor circuit and the negative-capacitor circuit may be configured to be dynamically controlled based on a known transmit signal. In some embodiments, the negative-inductor circuit may be configured to synthesize a negative inductance of a range of inductances. In some embodiments, the negative-capacitor circuit may include a plurality of capacitors coupled together in parallel. In some embodiments, each capacitor may include a first capacitor end and a second capacitor end. In some embodiments, the negative-capacitor circuit may be configured to synthesize a negative capacitance of a range of capacitances. In some embodiments, the negative-capacitor circuit may include a plurality of inductors coupled together in series. In some embodiments, each inductor may include a first inductor end and a second inductor end.

A system for transmitting information is disclosed, in accordance with one or more embodiments of the present disclosure. In some embodiments, the system includes a transmit signal source configured to generate a known transmit signal, the known transmit signal including a broadbanded signal. In some embodiments, the system includes a synthesized non-Foster time-variant filter. In some embodiments, the synthesized non-Foster time-variant filter includes a negative-inductor circuit and a negative-capacitor circuit. In some embodiments, the negative-inductor circuit and the negative-capacitor circuit are configured to be dynamically controlled based on the known transmit signal. In some embodiments, the negative-inductor circuit is configured to synthesize a negative inductance of a range of inductances. In some embodiments, the negative-inductor circuit includes a plurality of capacitors coupled together in parallel, each capacitor including a first capacitor end and a second capacitor end. In some embodiments, the negative-capacitor circuit is configured to synthesize a negative capacitance of a range of capacitances. In some embodiments, the negative-capacitor circuit includes a plurality of inductors coupled together in series, each inductor including a first inductor end and a second inductor end.

This Summary is provided solely as an introduction to subject matter that is fully described in the Detailed Description and Drawings. The Summary should not be considered to describe essential features nor be used to determine the scope of the claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims.

DETAILED DESCRIPTION

Figure 1A:
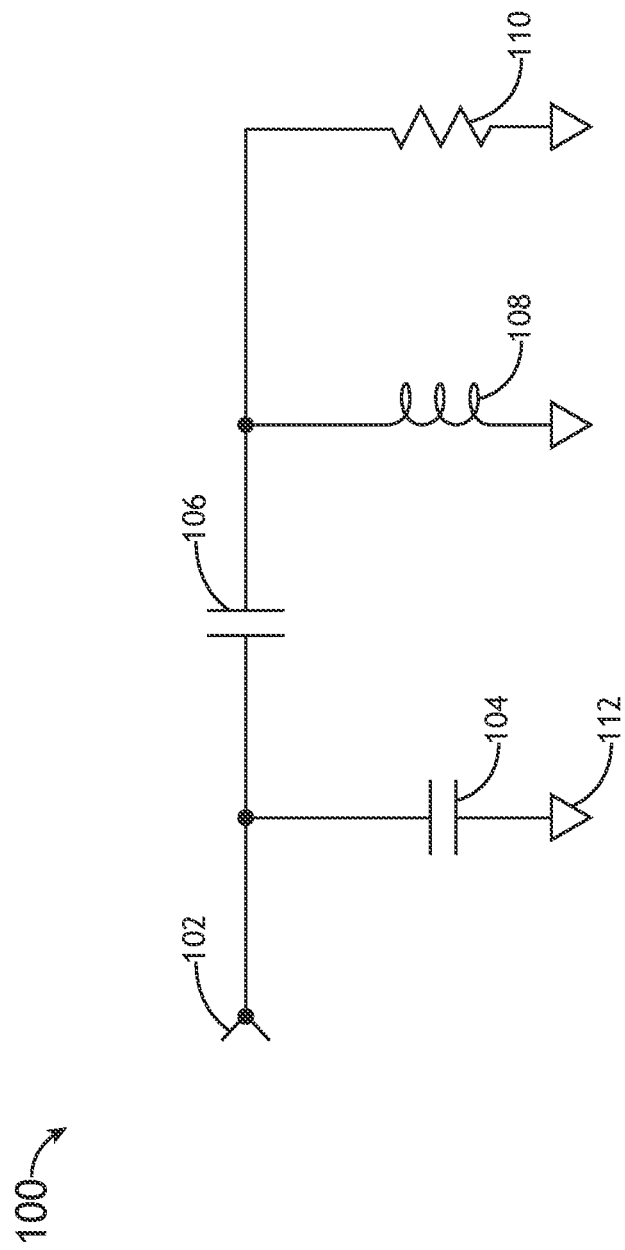
FIG. 1A is an illustration of a representative antenna circuit for mimicking a reactance of an antenna, in accordance with example embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "in embodiments, "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Using a non-Foster circuit as a time-variant filter in receiving antenna applications is disclosed in U.S. Pat. No. 7,859,474, issued on Dec. 28, 2010, based on a filing of U.S. patent application Ser. No. 12/221,893, filed on Aug. 7, 2008, all of which are hereby incorporated by reference in their entirety. It is contemplated that if the non-Foster circuit of U.S. Pat. No. 7,859,474 were used in a transmit (rather than receive) application, in high power (e.g., higher than 100 mW), and without advantages provided for by embodiments of the present disclosure, that such a non-Foster circuit may cause undesired harmonics, and power oscillation of the transmitting system as a whole.

Broadly speaking, embodiments of the inventive concepts disclosed herein are directed to using time-varying negative-inductance and time-varying negative-capacitance to provide for impedance matching functionality of a transmitting system. For example, switches used for negative-inductance may be configured to switch at most once per cycle and at conditions at or near zero current. Further, for example, switches used for negative-capacitance may be configured to switch at most once per cycle and at conditions at or near zero voltage. Such a system, compared to previous systems, may provide for relatively high efficiency in high RF power broadbanding configurations.

Referring to FIG. 1A, a representative antenna circuit 100 for mimicking a reactance of an antenna is disclosed.

The representative antenna circuit 100 may include a power source 102, a first capacitor 104, a second capacitor 106, an inductor 108, grounds 112 (e.g., electrically grounded wires), and a load 110 (e.g., transmitter, resistor).

Note that FIG. 1A may illustrate a theoretical circuit that approximates the electrical qualities of a generic antenna for various transmission signals. In other words, for example, the first capacitor 104, the second capacitor 106, and the inductor 108 do not necessarily actually exist and the entire representative antenna circuit 100 may be substituted by a generic antenna symbol. In this regard, the representative antenna circuit 100 diagram may be used to determine/calculate what qualities (e.g., what negative impedance value) an (actual) impedance matching circuit may need to produce to match the impedance of the generic antenna.

Figure 1B:
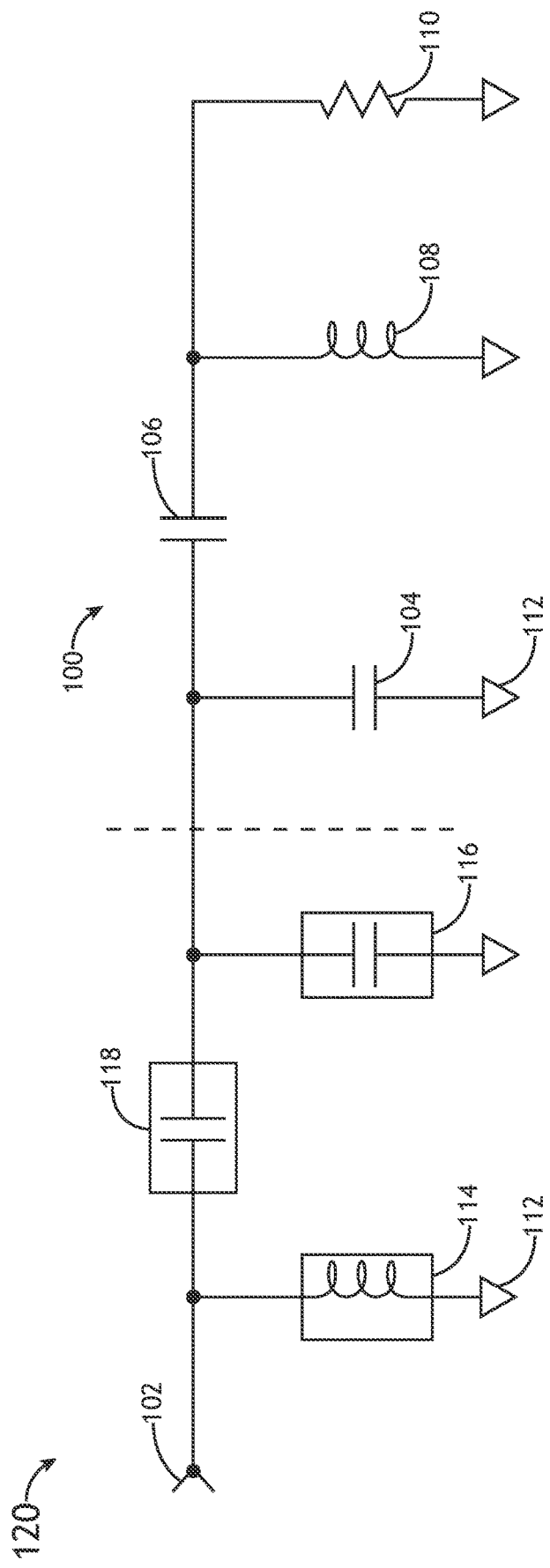
FIG. 1B is an illustration a system with negative inductances and negative capacitances coupled to the representative antenna circuit of FIG. 1A, in accordance with example embodiments of this disclosure.

Referring to FIG. 1B, a system 120 with negative inductances and negative capacitances coupled to the representative antenna circuit 100 of FIG. 1A is disclosed. In embodiments, the system 120 may be an impedance matching system. Note that an impedance matching system may, for purposes of the present disclosure, also be referred to as an antenna tuner, matchbox, matching network, transmatch, antenna match, antenna tuning unit (ATU), antenna coupler, feedline coupler, and/or the like. In embodiments, the system 120 may include, or be, and/or be referred to as a synthesized non-Foster time-variant filter.

In embodiments, the system 120 may include one or more negative components such as one or more negative capacitors 116, 118 (e.g., synthesized negative capacitors) and/or one or more negative inductors 114 (e.g., synthesized negative inductors).

In embodiments, a negative component as a discrete component does not necessarily exist. Rather, a negative component may be synthesized using one or more discrete and one or more time-varying and dynamically controllable components. For example, a negative component may be synthesized using discrete/fixed components and switches only. For nonlimiting examples of synthesized negative components using only discrete components (e.g., inductors or capacitors) and switches, see negative capacitor circuit 500 of FIG. 5 and negative inductor circuit 600 of FIG. 6.

The negative capacitors 116, 118 and the negative inductors 114 may be arranged and connected to match (e.g., symmetrically match or otherwise mimic an impedance of) the representative antenna circuit 100. In this regard, values of each component 116, 118, 114 of the system 120 may allow for matching the opposite/negative values of the (theoretical) values of (theoretical) representative components 104, 106, 110 of the representative antenna circuit 100. Note that the number of, arrangement of, and connected configuration of components 116, 118, 114 shown in figures are for example purposes only and any number, arrangement, and connected configuration may be used to match any type of antenna or theoretical representation of an antenna.

Figure 2:
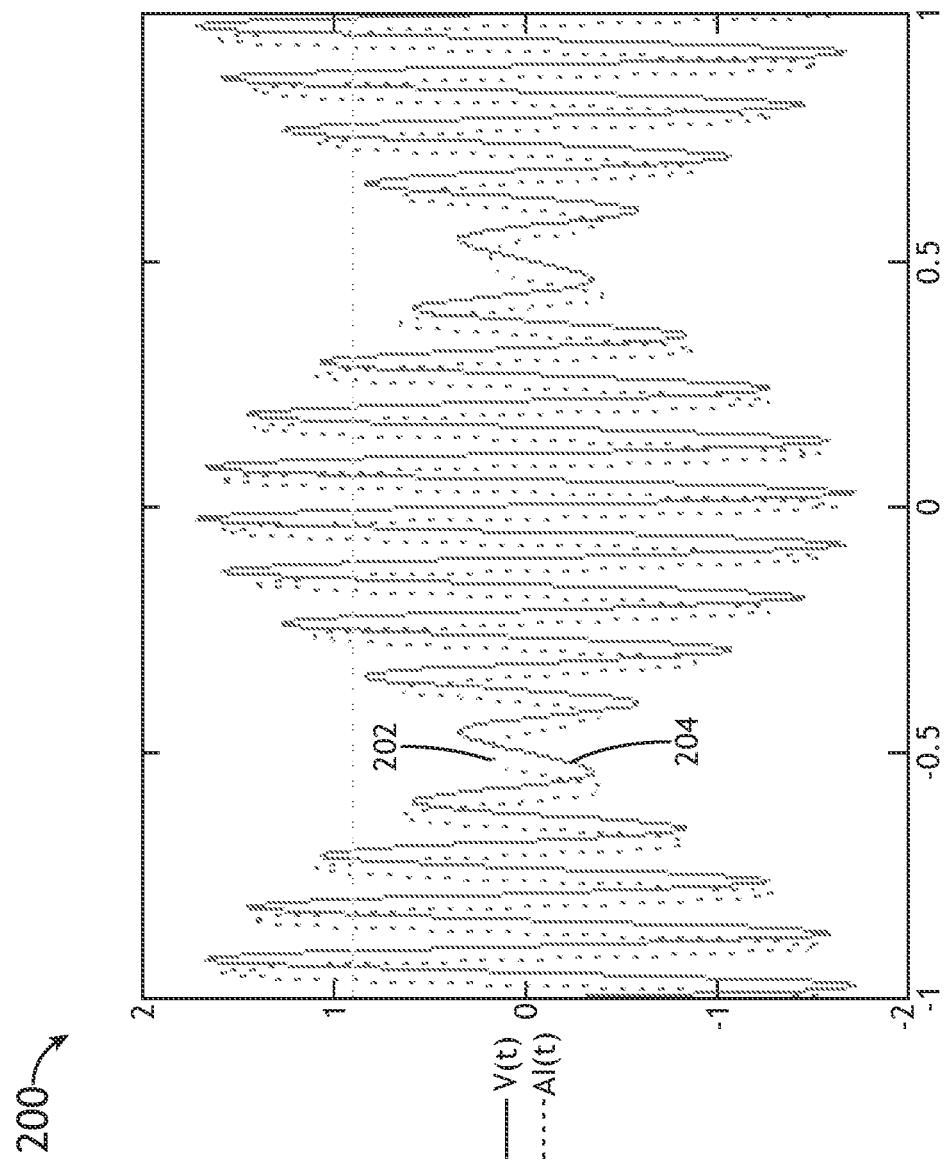
FIG. 2 is an illustration of a graphical plot of a current waveform of a fixed discrete capacitor based on an applied RF voltage waveform, in accordance with example embodiments of this disclosure.

Referring to FIG. 2, a graphical plot 200 of a current waveform 202 (i.e., capacitive current Al(t)) of a fixed discrete capacitor is disclosed. For example, the current waveform 202 may be the current produced based on based on an applied RF voltage waveform 204 (i.e., V(t)). For illustration purposes, a fixed discrete capacitor may be, for example, any simple, discrete, non-variable capacitor.

FIG. 2 may be used to illustrate the concept of a typical, simple capacitor current 202 when a varying voltage 204 is applied to the capacitor. The opposite/negative current (not shown) of the capacitor current 202 may be referred to as the negative capacitor current, the opposite capacitor current, and/or the like. As noted previously, a representative (theoretical) capacitor (e.g., capacitor 104 of FIG. 1B) may be negatively matched by a non-Foster time-variant filter 120 having a negative capacitor (e.g., negative-capacitor circuit 500) configured to produce such a negative capacitor current. In this regard, an impedance of an antenna 100 may be matched/negated by synthesizing the opposite impedance values with corresponding negative components of an impedance matching circuit (e.g., a non-Foster time-variant filter 120). This concept is further explained in one or more embodiments below.

In embodiments, the negative-inductor circuit 500 and the negative-capacitor circuit 600 are configured to be dynamically controlled based on a known transmit signal. For example, the known transmit signal may be a desired signal to be transmitted by the antenna and may be known a priori. For instance, the known transmit signal may be stored on memory of a controller, such as the same controller controlling switches of the non-Foster time-variant filter 120. Moreover, the known transmit signal may be used to anticipate/calculate/predict the impedance of the antenna 100, such as via simulation or a set of equations representative of the representative antenna circuit 100. For example, an antenna may be represented by the representative antenna circuit 100 of FIG. 1A and the representative antenna circuit 100 may be used to predict the impedance of components (e.g., inductor 108) for a given signal (e.g., for a voltage value corresponding to the voltage value needed to transmit such a signal including frequency modulation and/or amplitude modulation) using commonly known electrical diagram equations for solving such circuit diagrams for given voltage values. In this regard, an impedance as a function of time of an antenna 100 may be determined based on a known signal.

Being dynamically controlled generally means being selectively changed/adjusted over time. For example, negative components 114, 116, 118 may be dynamically controlled to match the negative values of corresponding components 104, 108, 106, respectively. For instance, dynamically controlled may mean, but is not limited to, adjusting (e.g., opening and/or closing) one or more switches of each negative component 114, 116, 118. For instance, the switches may be negative-capacitor switches 518 in FIG. 5 and/or negative-inductor switches 618 in FIG. 6. Such dynamic controlling may allow for synthesizing a wide range of negative impedance and negative inductor values.

It is contemplated that at least some embodiments herein may be more practical (e.g., efficient) for relatively higher power (e.g., more than 100 mW) transmit antenna impedance matching broadbanding solutions than other non-Foster configurations. For example, a benefit of some embodiments may reduce stress of the system 120 and/or components thereof. For instance, a timing of the dynamic controlling of negative components such as a timing of an adjustment (e.g., open/close of switches) disclosed herein may provide for advantages over previous methods. In embodiments, the dynamic controlling of the negative-inductor circuit may be configured to be performed at conditions of zero voltage. Not that the term "conditions of", for purposes of the present disclosure, includes exact values as well as proximate values. Proximate values include values that are within plus and minus an approximate value threshold equal to 10 percent of a maximum range of values over a representative period of time of a signal. An example of a representative period of time is 2 seconds as shown in FIG. 2. For FIG. 2 the maximum range of values is roughly 3.2 volts-thus, the approximate value threshold is 10 percent of 3.2 V, which is 0.32 volts. Using these values, the term "at conditions of zero voltage" includes values between −0.32 V and 0.32 V. In other words, for FIG. 2, a switching of the negative-capacitor switches 518 when a voltage is between −0.32 V and 0.32 V is considered "at conditions of zero voltage". A representative period of time should be at least 2 seconds, but can be longer if, for example, a period of longer than 2 seconds does not include any signals of a maximum strength typically produced by the antenna. For example, the representative period of time does not include a dormant antenna producing less than the maximum strength of signal it produces in a given day of typical operation.

In embodiments, the dynamic controlling of the negative-capacitor circuit is configured to be performed at conditions of zero current. As noted, "at conditions of" includes values within plus and minus an approximate value threshold equal to 10 percent of a maximum range of values over a representative period of time of a signal. For FIG. 2, for a maximum range of values of plus and minus 1.5 Amperes(l) (i.e., "Al" as shown in FIG. 2) the total range of values is 3.0. For such a total range, the term "at conditions of zero current" includes values between −0.30 l and 0.30 l.

Figure 3:
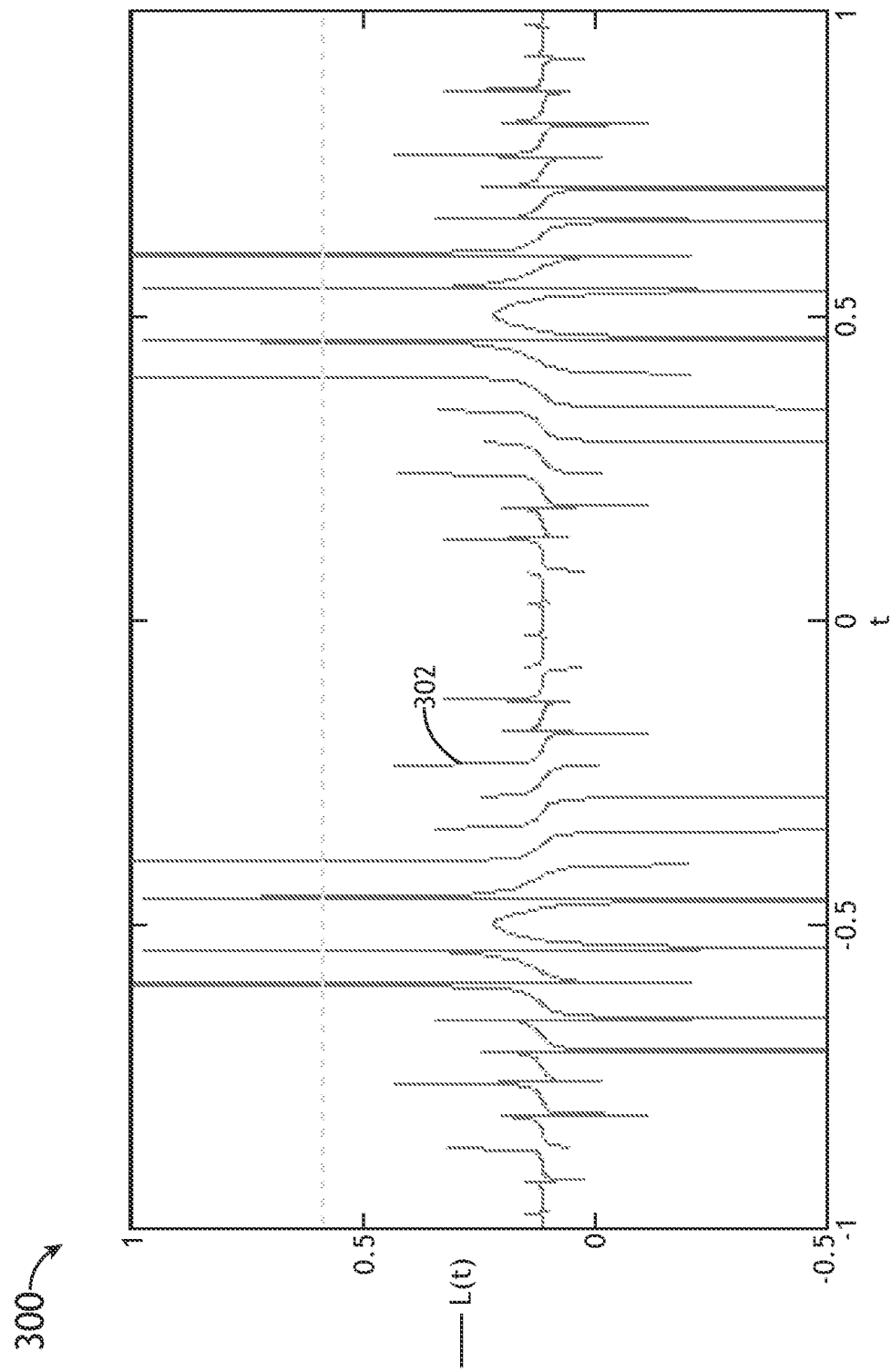
FIG. 3 is an illustration of a graphical plot of a controlled inductance waveform, when combined with the applied RF voltage waveform, for synthesizing a negative capacitor with a synthesized current waveform that is a negative of the current waveform of FIG. 2, in accordance with example embodiments of this disclosure.

Referring to FIG. 3, a graphical plot 300 of a controlled inductance waveform 302 is disclosed. The controlled inductance waveform 302, when combined with the applied RF voltage waveform 204, synthesizes a negative capacitor with a synthesized current waveform (not shown) that is a negative of the current waveform 202 of FIG. 2.

In embodiments, a negative component is used to generate the controlled inductance waveform 302. For example, the negative capacitor circuit 500 of FIG. 5 may be used to generate the controlled inductance waveform 302 by dynamically controlling switches over time.

Figure 4:
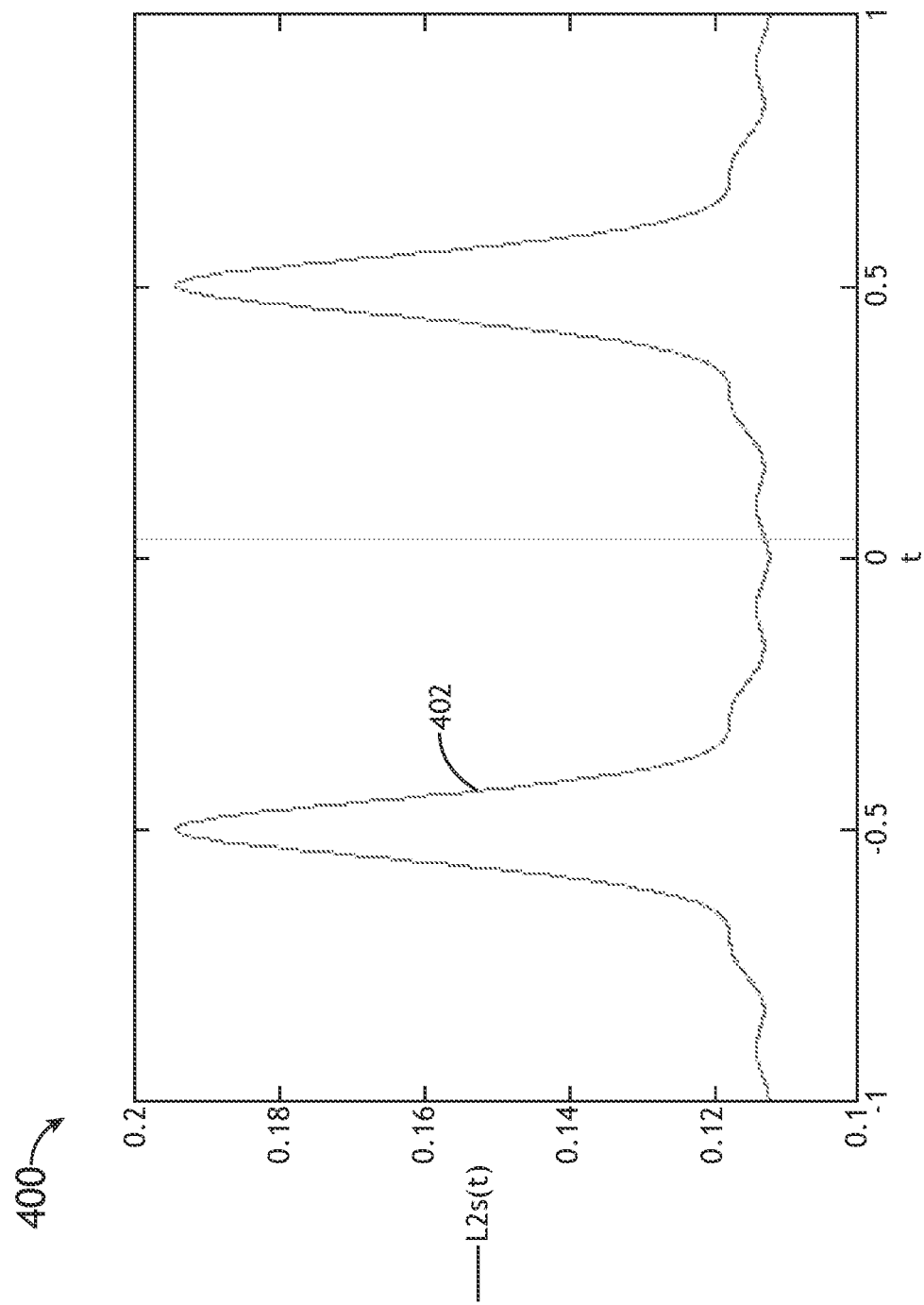
FIG. 4 is an illustration of a graphical plot of a second inductance waveform of a bandwidth-limited inductor for synthesizing a negative capacitor, in accordance with example embodiments of this disclosure.

Referring to FIG. 4, a graphical plot 400 of a second inductance waveform 402 of a bandwidth-limited inductor for synthesizing a negative capacitor is disclosed. For example, limitations of typical bandwidth-limited inductors used to synthesize negative capacitors in receiver antennas (rather than transmit antennas of the present disclosure) is illustrated by the second inductance waveform 402. For instance, as shown, such an inductor is limited to operation between values of roughly 0.1 and 0.2 L. Such a typical bandwidth-limited inductor does not have the range needed to produce values such as 0.1 and 0.9 L shown in the second inductance waveform 402 of FIG. 3.

Figure 5:
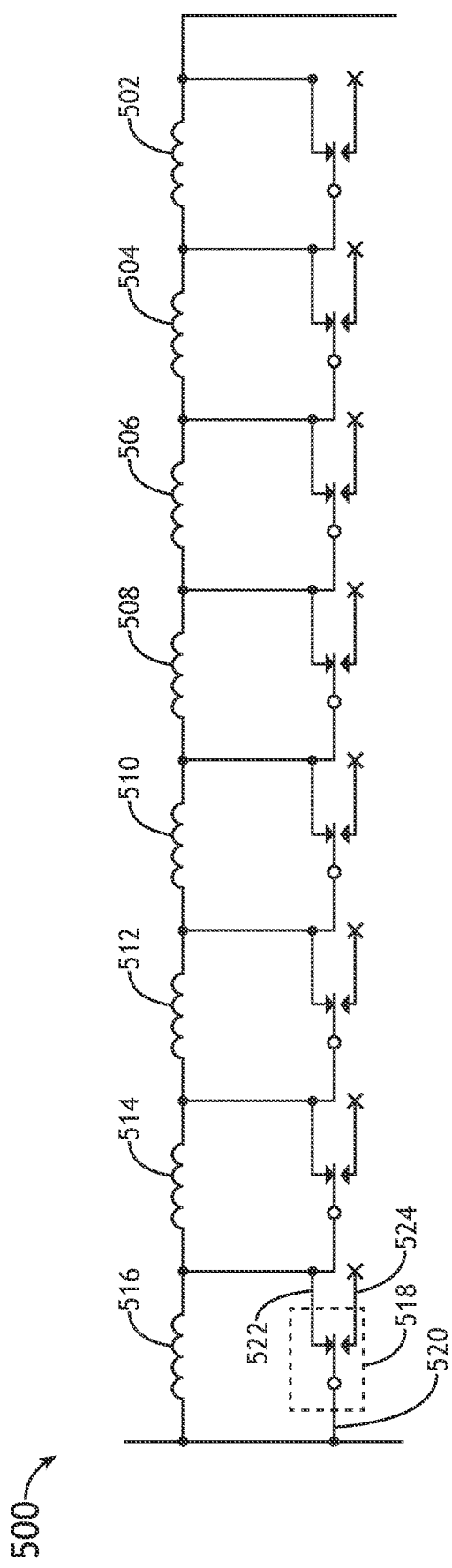
FIG. 5 is an illustration of a negative capacitor circuit, in accordance with example embodiments of this disclosure.

Referring to FIG. 5, a negative capacitor circuit 500 is disclosed. For example, the negative capacitor circuit 500 may synthesize a negative capacitor such as the first negative capacitor 116 and the second negative capacitor 118 of FIG. 1B. For instance, the negative-capacitor circuit 500 may synthesize a negative capacitance of a range of capacitances (e.g., negative capacitances).

In embodiments, the negative capacitor circuit 500 includes inductors (e.g., inductors 502 to 516, hereinafter referred to as inductor 502) coupled together in series. Each inductor 502 includes a first inductor end (the line shown leading to the left of inductor 502) and a second inductor end (the line shown leading to the right of inductor 502).

In embodiments, the negative capacitor circuit 500 includes negative-capacitor switches 518 coupled together in series. The negative-capacitor switches 518 include a first negative-capacitor switch end 520 and a second negative-capacitor switch end 520. Further, the negative-capacitor switches 518 may include an (unused) third negative-capacitor switch end 524.

In embodiments, for each inductor 502 (e.g., inductor 516) and respective negative-capacitor switch 518, the first inductor end is coupled to the first negative-capacitor switch end 520 as shown. Further, for each inductor 502 and its respective negative-capacitor switch 518, the second inductor end is coupled to the second negative-capacitor switch end 522. In this regard, each inductor 502 may be dynamically controlled to be bypassed (by closing/connecting each switch) and any number of inductors of various (e.g., different) values may be selectively combined to produce an overall negative capacitance of various values.

Figure 6:
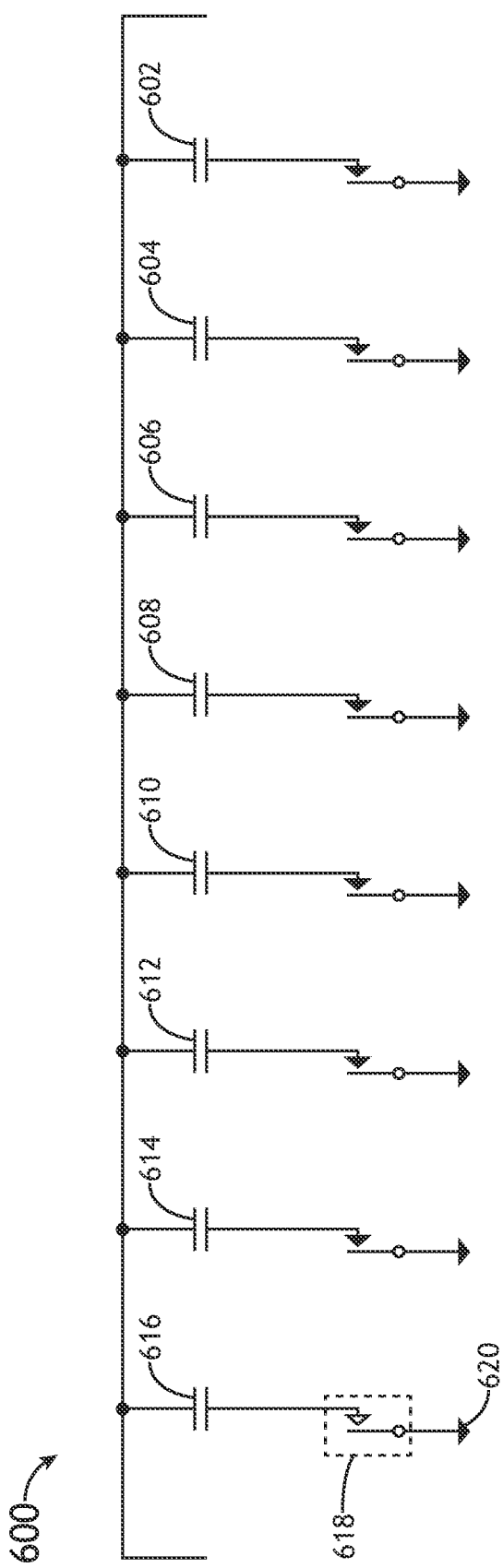
FIG. 6 is an illustration of a negative inductor circuit, in accordance with example embodiments of this disclosure.

Referring to FIG. 6, a negative inductor circuit 600 is disclosed.

For example, the negative inductor circuit 600 may synthesize a negative inductor such as the first negative capacitor 116 and the inductor 108 of FIG. 1B. For instance, the negative inductor circuit 600 may synthesize a negative inductance of a range of inductances (e.g., negative inductances).

In embodiments, the negative inductor circuit 600 includes capacitors (e.g., capacitors 602 to 616, hereinafter referred to as capacitor 602) coupled together in parallel. Each capacitor 602 includes a first capacitor end (the line shown leading to the bottom of capacitor 602) and a second capacitor end (the line shown leading to the top of capacitor 602).

In embodiments, the negative inductor circuit 600 includes negative-inductor switches 618 coupled together in series. The negative-inductor switches 618 include a first negative-inductor switch end (below) and a second negative-capacitor switch end (above). Further, the negative-inductor switches 618 may include an (unused) third negative-capacitor switch end (not shown) that does not necessarily connect to anything.

In embodiments, for each capacitor 602 (e.g., capacitor 616) and respective negative-inductor switch 618, the first capacitor end is coupled to the second negative-inductor switch end as shown.

Further, for each capacitor 602, the second capacitor ends are commonly connected together (e.g., electrically coupled to a common connection such as the horizontal line/wire near the top). Moreover, the first negative-inductor switch ends may be coupled to a grounding element 620. In this regard, each capacitor 602 may be dynamically controlled to be grounded (by closing/connecting each switch) and any number of capacitors 602 of various (e.g., different) values may be selectively combined in parallel to produce an overall negative capacitance of various values.

In embodiments, the components (e.g., inductors 502 and capacitors 602) may include (or be) discrete binary-weighted components. For example, although similarly applicable to the capacitors 602, the inductors may be discrete binary-weighted components. For instance, a simplified example of resistor values for three binary-weighted resistors are resistors that are double multiples (or close to) of each other (e.g., 2, 4, 8, 16, 32, or 3, 6, 12, 25, and/or the like). For an illustrative example, in a simple additional of discrete binary-weighted resistors of values R1 of 10 ohms, R2 of 20 ohms, and R3 of 40 ohms, various resistances may be produced be selectively bypassing various combinations of such resistors. For example, for such resistors, the resistances of 0, 10, 20, 30, 40, 50, 60, and 70 ohms may be produced. For example, to produce 30 ohms, R1 and R2 are used and R3 is bypassed. To produce 70 ohms, all three resistors are used. In this regard, at least for summable components such as resistors, discrete binary-weighted components may be used to generate a broad range of values in increments of the lowest value component.

As a nonlimiting example of binary-weighted inductors 502 in reference to FIG. 5, inductor 502 is 31N (i.e., 31 turns of a coil), inductor 504 is 62N, inductor 506 is 125N, inductor 508 is 250N, inductor 510 is 500N, inductor 512 is 1000N, inductor 514 is 2000N, and inductor 516 is 4000N.

As a nonlimiting example of binary-weighted capacitors 602 in reference to FIG. 6, the capacitors 602 to 616 may range from a specification value of 11P, 800C to roughly doubling up to a value of 1360P, 800C.

In embodiments, the system 120 may itself include an antenna and other components. For example, the system 120 may be a configured for transmitting information. For instance, the system 120 may include a transmit signal source (e.g., antenna 100 of FIG. 1B). For example, the transmit signal source 100 may be configured to generate the known transmit signal. For instance, the known transmit signal may include a broadbanded signal. A broadbanded signal is a signal that is modulated to be broadbanded over multiple frequency ranges over time. For instance, the system 120 and antenna 100 may be configured to transmit a known transmit signal that includes a relatively higher power signal (e.g., at least 100 mW signal).

Referring back to FIGS. 1A through 6, various calculations and the like are herein described, as may be used in one or more embodiments of the present disclosure.

Negative impedance is when current decreases for an increase in voltage, and vice versa. It is known that a capacitor has an impedance of $(i \omega C)^{-1}$, where $\omega$ is the radian frequency of the excitation wave, C is the capacitance value in farads, and i is the current. An inductor 108 has an impedance of $(i \omega L)$, where L is the inductance. A negative capacitor 116 is defined as having the same magnitude of impedance versus frequency as that of a standard capacitor 104, but with an opposite sign (e.g., a negative impedance). The impedance of an inductor 108 is the opposite of that of a capacitor, but a given capacitor and inductor will have the same magnitude of impedance at only a single frequency. This means a discrete inductor only simulates the negative impedance of a capacitor at a single frequency value. This is not desirable for broadbanding over large frequency ranges.

Some other solutions (not necessarily applicable to the present disclosure) for impedance matching use VLF transmitter installations, in which an inductive reactance is switched into series with the antenna feedpoint periodically synchronously with transitions between mark and space frequencies in a frequency-shift keying (FSK) modulated, continuous wave (CW) signal. However, applicability of this technique is limited to CW waveforms only.

It is contemplated herein, using embodiments of the present disclosure, that in the presence of a complex modulated RF waveform, comprised of both frequency and amplitude modulation, a narrow band antenna may be matched and broadbanded through the utilization of dynamically variable inductive and capacitive reactive elements, comprising a time variant filter.

It is possible to model with reasonable accuracy the frequency response of an antenna as a simple lumped element equivalent circuit. A model consisting of two capacitors 104, 106, a resistor 110, and an inductor 108 track the feedpoint impedance of a simple antenna 100 from direct current (DC) to a second harmonic of its resonant frequency. A sample configuration is depicted in FIG. 1A.

The representative antenna circuit 100 is broadbanded by placing a mirrored circuit 100 between the representative antenna circuit 100 and the power source 102 (e.g., RF source), in which all inductors 108 in the representative antenna circuit 100 are replaced by negative inductors 114, and all capacitors 104, 106 are replaced by negative capacitors 116, 118 as shown in FIG. 2B. Since negative components do not exist as discrete, passive devices, they must be synthesized. As noted previously, the transmitted waveform sent by the antenna 100 may be known a priori. Consequently, we may determine in real time the impedance of any element within the representative antenna circuit 100 in response to any applied RF waveform (e.g., known transmit signal), and fabricate/design a desired system 120 (e.g., impedance matching time variant filter) to match such predicted/known impedances.

Consider a capacitor of value C and an excitation waveform (e.g., known transmit signal) comprised of a series of frequency terms, having radian frequencies $\omega 1, \omega 2, \omega 3 \ldots$ with corresponding amplitudes $\alpha 1, \alpha 2, \alpha 3 \ldots$. If a signal $u(t)$ equaling $\alpha 1 \cos(\omega 1\, t) + \alpha 2 \cos(\omega 2\, t) + \alpha 3 \cos(\omega 3\, t) \ldots$ is applied to the capacitor, the resulting current IC(t) will equal $-\alpha 1\, \omega 1\, C \sin(\omega 1\, t) - \alpha 2\, \omega 2\, C \sin(\omega 2\, t) - \alpha 3\, \omega 3\, C \sin(\omega 3\, t) \ldots$.

A negative capacitive circuit 500 element possessing a current negative of that of C may be fabricated from inductive circuit elements 502.

By definition, the impedance of a circuit equals the applied voltage divided by the resultant current. Consequently, the impedance Z(t) of the capacitor with the voltage u(t) applied, resulting in current IC(t) is Z(t)=u(t)/IC(t). The current through an inductor of value L with this voltage u(t) applied will equal $\alpha 1 \sin(\omega 1\, t)/(\omega 1\, L) + \alpha 2 \sin(\omega 2\, t)/(\omega 2\, L) + \alpha 3 \sin(\omega 3\, t)/(\omega 3\, L) \ldots$.

There is no fixed value of L that permits a current equal to negative IC(t) to flow through L for varying frequency values. We must instead create a time variant value of L to account for frequency modulation of the signal.

An inductance (i.e., L9(t)) that behaves as a negative capacitor of value C in response to the applied voltage u(t) is defined by the following equation:

$L(t)=[\alpha 1\, \sin(\omega 1 t)/\omega 1 + \alpha 2\, \sin(\omega 2 t)/\omega 2 + \alpha 3\, \sin(\omega 3 t)/\omega 3 \ldots ]/C[\alpha 1\, \omega 1\, \sin(\omega 1 t) + \alpha 2\, \omega 2\, \sin(\omega 2 t) + \alpha 3\, \omega 3\, \sin(\omega 3 t) \ldots ]$ This can also be simplified as:

$$L(t) := \frac{\left(\int u(t)\, dt\right)}{\left[C \cdot \left(\frac{d}{dt} u(t)\right)\right]}$$

In practice, the time domain function L(t) has significant high-frequency content, including spikes of infinite value and frequency. As an example, see spikes in FIG. 3. In some examples, the time-variant inductor used in the circuit is updated only once per RF cycle, and limited in bandwidth to a carrier frequency.

Aside from the exemplary case of a negative capacitor, a negative inductor can be fabricated using complementary means, employing a time variant capacitor. When an RF voltage u(t) equaling $\alpha 1 \cos(\omega 1\, t) + \alpha 2 \cos(\omega 2\, t) + \alpha 3 \cos(\omega 3\, t) \ldots$ is applied to an inductor of value L, the resulting current IL(t) will equal $\alpha 1 \sin(\omega 1\, t)/(\omega 1\, L) + \alpha 2 \sin(\omega 2\, t)/(\omega 2\, L) + \alpha 3 \sin(\omega 3\, t)/(\omega 3\, L) \ldots$.

Such a time variant capacitor emulating a negative inductor of value −L in response to applied voltage u(t) will have a value C(t), where:

$C(t)=[\alpha 1\, \sin(\omega 1 t)/\omega 1 + \alpha 2\, \sin(\omega 2 t)/\omega 2 + \alpha 3\, \sin(\omega 3 t)/\omega 3 \ldots ]/L[\alpha 1\, \omega 1\, \sin(\omega 1 t) + \alpha 2\, \omega 2\, \sin(\omega 2 t) + \alpha 3\, \omega 3\, \sin(\omega 3 t) \ldots ]$ Which can be simplified as:

$$C(t) := \frac{\left(\int u(t)\, dt\right)}{\left[L \cdot \left(\frac{d}{dt} u(t)\right)\right]}$$

Other solutions for matching impedances in transmit applications (e.g., solutions not necessarily applicable to the present disclosure) use electronically variable inductances and capacitances such as saturable reactors and varactors, which are bandwidth or dynamic range limited.

In embodiments of the present disclosure, using such equations shown above, circuits comprised of switched, binary-weighted discrete inductors or capacitors may be employed as power digital-to analog converters. When switched using power devices such as GaN MOSFETs, circuits capable of handling hundreds of watts at hundreds of MHz are feasible using currently commercially available components.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

I claim:

1. A synthesized non-Foster time-variant filter comprising:
   a negative-inductor circuit; and
   a negative-capacitor circuit,
   wherein the negative-inductor circuit and the negative-capacitor circuit are configured to be dynamically controlled based on a known transmit signal,
   wherein the negative-inductor circuit is configured to synthesize a negative inductance of a range of inductances, wherein the negative-inductor circuit comprises:
      a plurality of capacitors coupled together in parallel, each capacitor comprising a first capacitor end and a second capacitor end;
   wherein the negative-capacitor circuit is configured to synthesize a negative capacitance of a range of capacitances, wherein the negative-capacitor circuit comprises:
      a plurality of inductors coupled together in series, each inductor comprising a first inductor end and a second inductor end.

2. The synthesized non-Foster time-variant filter of claim 1, wherein the dynamic controlling of the negative-inductor circuit is configured to be performed at conditions of zero voltage and the dynamic controlling of the negative-capacitor circuit is configured to be performed at conditions of zero current.

3. The synthesized non-Foster time-variant filter of claim 1, wherein the plurality of capacitors comprises discrete binary-weighted capacitors and the plurality of inductors comprises discrete binary-weighted inductors.

4. The synthesized non-Foster time-variant filter of claim 1, wherein the negative-inductor circuit further comprises:
   a plurality of respective negative-inductor switches, each respective negative-inductor switch comprising a first negative-inductor switch end and a second negative-inductor switch end.

5. The synthesized non-Foster time-variant filter of claim 4, wherein, for each capacitor and respective negative-inductor switch, the first capacitor end is coupled to the second negative-inductor switch end.

6. The synthesized non-Foster time-variant filter of claim 5, wherein, for each capacitor and the respective negative-inductor switch, for each capacitor and respective negative-inductor switch, the first negative-inductor switch end is coupled to a grounding element.

7. The synthesized non-Foster time-variant filter of claim 1, wherein the negative-capacitor circuit further comprises:
   a plurality of respective negative-capacitor switches coupled together in series, each respective negative-capacitor switch comprising a first negative-capacitor switch end and a second negative-capacitor switch end.

8. The synthesized non-Foster time-variant filter of claim 7, wherein, for each inductor and respective negative-capacitor switch, the first inductor end is coupled to the first negative-capacitor switch end.

9. The synthesized non-Foster time-variant filter of claim 8, wherein, for each inductor and the respective negative-capacitor switch, the second inductor end is coupled to the second negative-capacitor switch end.

10. A system for transmitting information comprising:
    a transmit signal source configured to generate a known transmit signal, the known transmit signal comprising a broadbanded signal;
    a synthesized non-Foster time-variant filter comprising:
       a negative-inductor circuit; and
       a negative-capacitor circuit,
    wherein the negative-inductor circuit and the negative-capacitor circuit are configured to be dynamically controlled based on the known transmit signal,
    wherein the negative-inductor circuit is configured to synthesize a negative inductance of a range of inductances, wherein the negative-inductor circuit comprises:
       a plurality of capacitors coupled together in parallel, each capacitor comprising a first capacitor end and a second capacitor end;
    wherein the negative-capacitor circuit is configured to synthesize a negative capacitance of a range of capacitances, wherein the negative-capacitor circuit comprises:
       a plurality of inductors coupled together in series, each inductor comprising a first inductor end and a second inductor end.

11. The system of claim 10, wherein the dynamic controlling of the negative-inductor circuit is configured to be performed at conditions of zero voltage and the dynamic controlling of the negative-capacitor circuit is configured to be performed at conditions of zero current.

12. The system of claim 10, wherein the plurality of capacitors comprises discrete binary-weighted capacitors and the plurality of inductors comprises discrete binary-weighted inductors.

13. The system of claim 10, wherein the negative-inductor circuit further comprises:
    a plurality of respective negative-inductor switches, each respective negative-inductor switch comprising a first negative-inductor switch end and a second negative-inductor switch end.

14. The system of claim 13, wherein, for each capacitor and respective negative-inductor switch, the first capacitor end is coupled to the second negative-inductor switch end.

15. The system of claim 14, wherein, for each capacitor and the respective negative-inductor switch, for each capacitor and respective negative-inductor switch, the first negative-inductor switch end is coupled to a grounding element.

16. The system of claim 10, wherein the negative-capacitor circuit further comprises:
    a plurality of respective negative-capacitor switches coupled together in series, each respective negative-capacitor switch comprising a first negative-capacitor switch end and a second negative-capacitor switch end.

17. The system of claim 16, wherein, for each inductor and respective negative-capacitor switch, the first inductor end is coupled to the first negative-capacitor switch end.

18. The system of claim 17, wherein, for each inductor and the respective negative-capacitor switch, the second inductor end is coupled to the second negative-capacitor switch end.

19. The system of claim 10, wherein the known transmit signal is frequency modulated and amplitude modulated.

20. The system of claim 10, wherein a plurality of respective negative-inductor switches and a plurality of respective negative-capacitor switches are controlled via a control device, the control device comprising at least one GaN MOSFET.

* * * * *